(12) United States Patent
Pfeuffer et al.

(10) Patent No.: US 12,266,641 B2
(45) Date of Patent: Apr. 1, 2025

(54) MULTI-CHIP CARRIER STRUCTURE

(71) Applicant: OSRAM Opto Semiconductors GmbH, Regensburg (DE)

(72) Inventors: Alexander Pfeuffer, Regensburg (DE); Korbinian Perzlmaier, Regensburg (DE); Kerstin Neveling, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 652 days.

(21) Appl. No.: 17/611,112

(22) PCT Filed: Mar. 10, 2020

(86) PCT No.: PCT/EP2020/056296
§ 371 (c)(1),
(2) Date: Nov. 12, 2021

(87) PCT Pub. No.: WO2020/229013
PCT Pub. Date: Nov. 19, 2020

(65) Prior Publication Data
US 2022/0223756 A1 Jul. 14, 2022

(30) Foreign Application Priority Data

May 13, 2019 (DE) .................... 10 2019 112 490.5
Jan. 29, 2020 (WO) ................. PCT/EP2020/052191

(51) Int. Cl.
*H01L 25/075* (2006.01)
*H01L 33/24* (2010.01)
(Continued)

(52) U.S. Cl.
CPC .......... *H01L 25/0753* (2013.01); *H01L 33/24* (2013.01); *H01L 33/505* (2013.01);
(Continued)

(58) Field of Classification Search
CPC ........................ H01L 25/0753; H01L 33/24
See application file for complete search history.

(56) References Cited

U.S. PATENT DOCUMENTS

| | | | |
|---|---|---|---|
| 4,897,614 A | 1/1990 | Nishio | |
| 4,979,002 A | 12/1990 | Pankove | |

(Continued)

FOREIGN PATENT DOCUMENTS

| | | | |
|---|---|---|---|
| DE | 19744793 A1 | 4/1998 | |
| DE | 19751649 A1 | 5/1999 | |

(Continued)

OTHER PUBLICATIONS

Notice of Allowance in U.S. Appl. No. 17/475,030, mailed Jun. 15, 2022, 42 pages.

(Continued)

*Primary Examiner* — Mark W Tornow
(74) *Attorney, Agent, or Firm* — ArentFox Schiff LLP (57) ABSTRACT

A support structure for receiving planar microchips, comprising a planar support substrate and at least two receiving elements. The receiving elements are connected to the carrier substrate and configured in such a way that they detachably hold a flat microchip between the at least two receiving elements in such a way that the microchip can be moved out with a defined minimum force transversely to a support structure plane.

17 Claims, 4 Drawing Sheets

(51) Int. Cl.
    *H01L 33/32* (2010.01)
    *H01L 33/50* (2010.01)
    *H01L 33/60* (2010.01)
(52) U.S. Cl.
    CPC .............. *H01L 33/60* (2013.01); *H01L 33/32* (2013.01); *H01L 2933/0083* (2013.01); *H01L 2933/0091* (2013.01)

(56) References Cited

U.S. PATENT DOCUMENTS

| | | |
|---|---|---|
| 5,103,271 A | 4/1992 | Izumiya et al. |
| 5,526,063 A | 7/1996 | Joubert et al. |
| 5,537,171 A | 7/1996 | Ogino et al. |
| 7,067,339 B2 | 6/2006 | Biwa et al. |
| 7,254,282 B2 | 8/2007 | Sathyanarayana |
| 8,049,233 B2 | 11/2011 | Fukshima et al. |
| 8,349,116 B1 | 1/2013 | Bibl et al. |
| 8,536,026 B2 | 9/2013 | Park et al. |
| 8,586,965 B2 | 11/2013 | Toyoda et al. |
| 9,202,988 B2 | 12/2015 | Yoshida et al. |
| 9,318,645 B2 | 4/2016 | Tani et al. |
| 9,368,683 B1 | 6/2016 | Meitl et al. |
| 9,472,734 B1 | 10/2016 | Chen et al. |
| 9,923,013 B1 | 3/2018 | Yamashita et al. |
| 10,069,036 B2 | 9/2018 | Atanackovic |
| 10,096,585 B2 | 10/2018 | Tanaka et al. |
| 10,162,182 B2 | 12/2018 | Jepsen |
| 10,177,195 B2 | 1/2019 | Ahmed et al. |
| 10,395,589 B1 | 8/2019 | Vahid Far et al. |
| 10,396,241 B1 | 8/2019 | Perkins |
| 10,418,517 B2 | 9/2019 | Atanackovic |
| 10,466,487 B2 | 11/2019 | Blum et al. |
| 10,490,695 B2 | 11/2019 | Gomez-Iglesias et al. |
| 10,522,787 B1 | 12/2019 | Montgomery et al. |
| 10,622,514 B1 | 4/2020 | Atanackovic |
| 10,802,334 B2 | 10/2020 | Kim et al. |
| 10,833,225 B2 | 11/2020 | Bower et al. |
| 10,903,193 B2 | 1/2021 | Yamada |
| 10,963,103 B1 | 3/2021 | Shahmohammadi |
| 10,985,143 B2 | 4/2021 | Bower et al. |
| 11,156,759 B2 | 10/2021 | Brick et al. |
| 11,367,807 B2 | 6/2022 | Wada et al. |
| 11,513,275 B2 | 11/2022 | Brick et al. |
| 11,552,057 B2 | 1/2023 | Chae et al. |
| 2003/0141507 A1 | 7/2003 | Krames et al. |
| 2003/0189125 A1 | 10/2003 | Trierenberg |
| 2004/0189627 A1 | 9/2004 | Shirasaki et al. |
| 2005/0194598 A1 | 9/2005 | Kim et al. |
| 2005/0237488 A1 | 10/2005 | Yamasaki et al. |
| 2005/0264472 A1 | 12/2005 | Rast |
| 2006/0002247 A1 | 1/2006 | Kim et al. |
| 2006/0164345 A1 | 7/2006 | Sarma et al. |
| 2006/0192225 A1 | 8/2006 | Chua et al. |
| 2007/0057249 A1 | 3/2007 | Kim et al. |
| 2007/0096127 A1 | 5/2007 | Pattison et al. |
| 2008/0061304 A1 | 3/2008 | Huang et al. |
| 2009/0045416 A1 | 2/2009 | Bierhuizen et al. |
| 2009/0229097 A1 | 9/2009 | Crandemire |
| 2009/0291237 A1 | 11/2009 | Park et al. |
| 2009/0315054 A1 | 12/2009 | Kim et al. |
| 2010/0019697 A1 | 1/2010 | Korsunsky et al. |
| 2010/0163894 A1 | 7/2010 | Uemura et al. |
| 2010/0252103 A1 | 10/2010 | Yao et al. |
| 2010/0317132 A1 | 12/2010 | Rogers et al. |
| 2011/0151602 A1 | 6/2011 | Speier |
| 2011/0156616 A1 | 6/2011 | Anderson et al. |
| 2011/0204327 A1 | 8/2011 | Hiruma et al. |
| 2011/0254043 A1 | 10/2011 | Negishi et al. |
| 2011/0263054 A1 | 10/2011 | Yu et al. |
| 2012/0126229 A1 | 5/2012 | Bower |
| 2012/0223289 A1 | 9/2012 | Gwo et al. |
| 2013/0063413 A1 | 3/2013 | Miyake |
| 2013/0063815 A1 | 3/2013 | Kubota |
| 2013/0082624 A1 | 4/2013 | Brassfield et al. |
| 2013/0249972 A1 | 9/2013 | Nishino et al. |
| 2013/0328066 A1 | 12/2013 | Sabathil et al. |
| 2014/0008677 A1 | 1/2014 | Zhu et al. |
| 2014/0054619 A1 | 2/2014 | Tseng et al. |
| 2014/0111559 A1 | 4/2014 | Yang et al. |
| 2014/0131753 A1 | 5/2014 | Ishida et al. |
| 2014/0159064 A1 | 6/2014 | Sakariya et al. |
| 2014/0319560 A1 | 10/2014 | Tischler |
| 2014/0340900 A1 | 11/2014 | Bathurst et al. |
| 2015/0103070 A1 | 4/2015 | In et al. |
| 2015/0103404 A1 | 4/2015 | Rudy et al. |
| 2015/0162560 A1 | 6/2015 | Chen et al. |
| 2015/0186099 A1 | 7/2015 | Hall |
| 2015/0187991 A1 | 7/2015 | McGroddy et al. |
| 2015/0207399 A1 | 7/2015 | Li et al. |
| 2015/0280086 A1 | 10/2015 | Jang et al. |
| 2015/0293302 A1 | 10/2015 | Czornomaz et al. |
| 2016/0013167 A1 | 1/2016 | Sakariya et al. |
| 2016/0240159 A1 | 8/2016 | Ohkawa et al. |
| 2016/0315218 A1 | 10/2016 | Bour et al. |
| 2016/0341942 A1 | 11/2016 | Cheon et al. |
| 2016/0351539 A1 | 12/2016 | Bower et al. |
| 2017/0061878 A1 | 3/2017 | Park et al. |
| 2017/0082263 A1 | 3/2017 | Byrnes et al. |
| 2017/0133357 A1 | 5/2017 | Kuo et al. |
| 2017/0186740 A1 | 6/2017 | Cok et al. |
| 2017/0236885 A1 | 8/2017 | Koshihara et al. |
| 2017/0254518 A1 | 9/2017 | Vasylyev |
| 2017/0270852 A1 | 9/2017 | Meitl et al. |
| 2017/0278733 A1 | 9/2017 | Chang et al. |
| 2017/0287402 A1 | 10/2017 | Toyomura et al. |
| 2017/0352309 A1 | 12/2017 | Chang et al. |
| 2017/0352313 A1 | 12/2017 | Miyake |
| 2017/0371087 A1 | 12/2017 | You et al. |
| 2018/0005562 A1 | 1/2018 | Lin et al. |
| 2018/0012540 A1 | 1/2018 | Hosoyachi et al. |
| 2018/0033768 A1 | 2/2018 | Kumar et al. |
| 2018/0075798 A1 | 3/2018 | Nho et al. |
| 2018/0097033 A1 | 4/2018 | Ahmed et al. |
| 2018/0114878 A1 | 4/2018 | Danesh et al. |
| 2018/0180249 A1 | 6/2018 | Yamada et al. |
| 2018/0182298 A1 | 6/2018 | Jang et al. |
| 2018/0190712 A1 | 7/2018 | Xu et al. |
| 2018/0211595 A1 | 7/2018 | Takahashi et al. |
| 2018/0219144 A1 | 8/2018 | Perkins et al. |
| 2018/0247586 A1 | 8/2018 | Vahid Far et al. |
| 2018/0269234 A1* | 9/2018 | Hughes ................. H01L 27/156 |
| 2018/0275410 A1 | 9/2018 | Yeoh et al. |
| 2018/0301433 A1 | 10/2018 | Robin et al. |
| 2018/0308832 A1 | 10/2018 | Shin et al. |
| 2018/0323116 A1 | 11/2018 | Wu et al. |
| 2018/0331258 A1 | 11/2018 | Halbritter et al. |
| 2018/0342492 A1 | 11/2018 | Lu |
| 2018/0367769 A1 | 12/2018 | Greenberg |
| 2019/0012965 A1 | 1/2019 | Fu et al. |
| 2019/0013439 A1 | 1/2019 | Sung et al. |
| 2019/0044023 A1 | 2/2019 | Cheng et al. |
| 2019/0058081 A1 | 2/2019 | Ahmed et al. |
| 2019/0066571 A1 | 2/2019 | Goward |
| 2019/0066587 A1 | 2/2019 | Han |
| 2019/0113199 A1 | 4/2019 | Pellarin et al. |
| 2019/0113727 A1 | 4/2019 | Tamma |
| 2019/0137757 A1 | 5/2019 | Rousseau |
| 2019/0165209 A1 | 5/2019 | Bonar et al. |
| 2019/0174079 A1 | 6/2019 | Anthony et al. |
| 2019/0195466 A1 | 6/2019 | Shimizu et al. |
| 2019/0198716 A1 | 6/2019 | Gordon et al. |
| 2019/0229097 A1 | 7/2019 | Takeya et al. |
| 2019/0235234 A1 | 8/2019 | Hu et al. |
| 2019/0258346 A1 | 8/2019 | Cheng et al. |
| 2019/0293939 A1 | 9/2019 | Sluka |
| 2019/0305185 A1 | 10/2019 | Lauermann et al. |
| 2019/0347979 A1 | 11/2019 | Ahmed |
| 2019/0378674 A1 | 12/2019 | Chou et al. |
| 2019/0383474 A1 | 12/2019 | Vasylyev |
| 2019/0386173 A1 | 12/2019 | Chen et al. |
| 2020/0119233 A1 | 4/2020 | Dupont |
| 2020/0134624 A1* | 4/2020 | Zhang ................. G06Q 20/405 |
| 2020/0219855 A1 | 7/2020 | Chen et al. |

(56) References Cited

U.S. PATENT DOCUMENTS

| | | |
|---|---|---|
| 2020/0227594 A1 | 7/2020 | Kuo |
| 2020/0343230 A1 | 10/2020 | Sizov et al. |
| 2020/0357103 A1 | 11/2020 | Wippermann et al. |
| 2020/0366067 A1 | 11/2020 | David et al. |
| 2021/0043617 A1 | 2/2021 | Onuma et al. |
| 2021/0124247 A1 | 4/2021 | Mezouari et al. |
| 2021/0134624 A1* | 5/2021 | Zhang ................ H01L 25/0753 |
| 2021/0272938 A1 | 9/2021 | Chang et al. |
| 2021/0313497 A1 | 10/2021 | Pourquier |
| 2021/0325594 A1 | 10/2021 | Meng et al. |
| 2021/0375833 A1* | 12/2021 | Lee .................... H01L 33/0095 |
| 2021/0405276 A1 | 12/2021 | Brick et al. |
| 2022/0102583 A1 | 3/2022 | Baumheinrich et al. |
| 2022/0285591 A1 | 9/2022 | Biebersdorf et al. |
| 2022/0285592 A1 | 9/2022 | Biebersdorf et al. |
| 2022/0293829 A1 | 9/2022 | Biebersdorf et al. |
| 2022/0293830 A1 | 9/2022 | Biebersdorf et al. |
| 2022/0310888 A1 | 9/2022 | Biebersdorf et al. |
| 2022/0352436 A1 | 11/2022 | Biebersdorf et al. |

FOREIGN PATENT DOCUMENTS

| | | |
|---|---|---|
| DE | 19911717 A1 | 9/2000 |
| DE | 10009782 A1 | 9/2001 |
| DE | 102007043877 A1 | 1/2009 |
| DE | 102007046339 A1 | 4/2009 |
| DE | 102005063159 B4 | 5/2009 |
| DE | 102012008833 A1 | 11/2012 |
| DE | 102013104273 A1 | 10/2014 |
| DE | 102017106755 A1 | 10/2018 |
| DE | 102017109083 A1 | 10/2018 |
| DE | 102018108022 A1 | 10/2018 |
| DE | 102017114369 A1 | 1/2019 |
| DE | 102018113363 A1 | 12/2019 |
| DE | 102018119312 A1 | 2/2020 |
| DE | 102018119376 A1 | 2/2020 |
| EP | 0488772 A1 | 6/1992 |
| EP | 1544660 A1 | 6/2005 |
| EP | 1553640 A1 | 7/2005 |
| EP | 1887634 A2 | 2/2008 |
| EP | 2323185 A2 | 5/2011 |
| EP | 2396818 A2 | 12/2011 |
| EP | 2430652 A1 | 3/2012 |
| EP | 2609624 A0 | 3/2012 |
| EP | 2477240 A1 | 7/2012 |
| EP | 2506321 A1 | 10/2012 |
| EP | 2642537 A2 | 9/2013 |
| EP | 2685155 A2 | 1/2014 |
| EP | 2750208 A2 | 7/2014 |
| EP | 2838130 A1 | 2/2015 |
| EP | 2924490 A2 | 9/2015 |
| EP | 2980866 A1 | 2/2016 |
| EP | 2986082 A1 | 2/2016 |
| EP | 3010048 A1 | 4/2016 |
| EP | 3031086 A1 | 6/2016 |
| EP | 2676528 B1 | 8/2017 |
| EP | 3226042 A1 | 10/2017 |
| EP | 2704215 B1 | 4/2018 |
| EP | 3367374 A1 | 8/2018 |
| JP | S62269385 A | 11/1987 |
| JP | H06244457 A | 9/1994 |
| JP | 2004-228297 A | 8/2004 |
| JP | 2005244220 A | 9/2005 |
| JP | 2005346066 A | 12/2005 |
| JP | 2007264610 A | 10/2007 |
| JP | 2007324416 A | 12/2007 |
| JP | 2009141254 A | 6/2009 |
| JP | 2009186794 A | 8/2009 |
| JP | 2009260357 A | 11/2009 |
| JP | 2010272245 A | 12/2010 |
| JP | 2013048282 A | 3/2013 |
| JP | 2013110154 A | 6/2013 |
| JP | 2014019436 A | 2/2014 |
| JP | 2015099238 A | 5/2015 |
| JP | 2016208012 A | 12/2016 |
| JP | 2017152655 A | 8/2017 |
| JP | 2017-533453 A | 11/2017 |
| JP | 2017535966 A | 11/2017 |
| JP | 2018063975 A | 4/2018 |
| JP | 2018-191006 A | 11/2018 |
| JP | 2019009438 A | 1/2019 |
| JP | 2019029473 A | 2/2019 |
| KR | 20130052944 A | 5/2013 |
| WO | 2004084318 A1 | 9/2004 |
| WO | 2006035212 A1 | 4/2006 |
| WO | 2007001099 A1 | 1/2007 |
| WO | 2009082121 A2 | 7/2009 |
| WO | 2010019594 A2 | 2/2010 |
| WO | 2010132552 A1 | 11/2010 |
| WO | 2010149027 A1 | 12/2010 |
| WO | 2011069747 A1 | 6/2011 |
| WO | 2011117056 A1 | 9/2011 |
| WO | 2011160051 A2 | 12/2011 |
| WO | 2012014857 A1 | 2/2012 |
| WO | 2013026440 A2 | 2/2013 |
| WO | 2014047113 A1 | 3/2014 |
| WO | 2014093063 A1 | 6/2014 |
| WO | 2015138102 A1 | 9/2015 |
| WO | 2016025325 A1 | 2/2016 |
| WO | 2016054092 A1 | 4/2016 |
| WO | 2016060677 A1 | 4/2016 |
| WO | 2017087312 A1 | 5/2017 |
| WO | 2017111827 A1 | 6/2017 |
| WO | 2017120320 A1 | 7/2017 |
| WO | 2017120341 A1 | 7/2017 |
| WO | 2017197576 A1 | 11/2017 |
| WO | 2018117382 A1 | 6/2018 |
| WO | 2018123280 A1 | 7/2018 |
| WO | 2018179540 A1 | 10/2018 |

OTHER PUBLICATIONS

Buljan et al., "Ultra-Compact Multichannel Freeform Optics for 4xWUXGA OLED Microdisplays," Proc. SPIE 10676, Digital Optics for Immersive Displays, 9 pages (2018).

Fortuna, "Integrated Nanoscale Antenna-LED for On-Chip Optical Communication," UC Berkeley, 146 pages (2017).

Li et al., "Waveguiding in Vertical Cavity Quantum-Well Structure Defined by Ion Implantation," J. Lightwave Technol. 16, pp. 1498-1508 (1998).

Ogihara et al., "1200 Dots-Per-Inch Light Emitting Diode Array Fabricated by Solid-Phase Zinc Diffusion," IEICE Transactions on Electronics, 80;3, pp. 489-497 (1997).

Stevens et al., "Varifocal Technologies Providing Prescription and VAC Mitigation In HMDs Using Alvarez Lenses," Proc. SPIE 10676, Digital Optics for Immersive Displays, 18 pages (2018).

Tomioka et al., "Selective-Area Growth of III-V Nanowires and Their Applications," Journal of Materials Research, 26 (17), pp. 2127-2141 (2011).

Waldern et al., "DigiLens Switchable Bragg Grating Waveguide Optics for Augmented Reality Applications," Proc. SPIE 10676, Digital Optics for Immersive Displays, 17 pages (2018).

Wheelwright et al., "Field of View: Not Just A Number," Proc. SPIE 10676, Digital Optics for Immersive Displays, 8 pages (2018).

Yu et al., "Hybrid LED Driver for Multi-Channel Output with High Consistency," 2015 IEEE 11th International Conference on ASIC (ASICON), Chengdu, 4 pages (2015).

Huang et al., "Metasurface holography: from fundamentals to applications," Nanophotonics. 7(6), pp. 1169-1190 (2018).

Volz et al., "Influence of annealing on the optical and structural properties of dilute N-containing III/V semiconductor heterostructures," Journal of Crystal Growth, Jan. 2007, vol. 298, pp. 126-130.

* cited by examiner

MULTI-CHIP CARRIER STRUCTURE

This patent application is a 35 U.S.C. § 371 National Phase of PCT Application No. PCT/EP2020/056296, filed Mar. 10, 2020, which claims priority to German application DE 10 2019 112 490.5, filed May 13, 2019, and priority to International application PCT/EP2020/052191, filed Jan. 29, 2020, the disclosures of which are hereby incorporated by reference.

The invention relates to optoelectronic devices, but also in general to semiconductor devices for optical displays. In particular, the invention relates to a support structure for LED chips for use in a mass transfer process for manufacturing optoelectronic displays.

BACKGROUND

While organic LED technologies, among others, have gained in importance in recent years, inorganic light-emitting diodes are now increasingly coming back into focus as the basis for a new range of applications. In addition to classic display applications, these also include lighting applications for video walls, interior lighting, for motor vehicles in the interior, headlights or gadget lighting, general luminaires and special applications in the industrial sector.

Basically, the technology for generating the light follows the known processes as they are known from classic optoelectronic components, also called LEDs. In particular, the possibility of realizing bright and high-contrast LEDs with simultaneously low consumption opens up new areas of application. One of the main differences, however, is that the sizes of these LED chips are much more variable and tailored to the respective application. The sizes range from 1 mm² to approx. 100 µm².

In addition to various technical challenges associated with manufacturing such LEDs on a wafer with respect to the accuracy, efficiency and effectiveness of a manufacturing process for LEDs, the transfer and subsequent electrical contacting of the LEDs on a backplane or CB or similar without a defect plays a role. While the size of the LED's may allow for later repair or replacement of defective light emitting diodes, a sufficiently defect-free transfer and accurate positioning of the LED's and attachment can further reduce the risk of a defect and thus the cost.

Processes such as the transfer printing process are well known. These simultaneously pick up a large number of LEDs from a wafer using a flat stamp, move them to the carrier surface of the subsequent display and precisely assemble them there into a large-area overall arrangement. For this purpose, an elastomer stamp can be used, for example, to which the individual LEDs adhere without being mechanically or electrically damaged due to suitable surface structures and material properties. These stamps use, for example, so-called PDMS elastomers from the group of silicones. Frequently, these elastomer stamps have so-called cushion structures, which can allow targeted and better adhesion of the chips to be placed. In the prior art, further methods of transfer printing are known. In addition to the elastomer-based processes described, magnetic, electrostatic or mechanical processes based on rolling movements, among other things, are known.

After manufacture on the wafer, the finished LEDs must be such that they can be picked up and moved away by a suitable process. For this purpose, the LEDs are usually detached from a substrate by etching processes, for example. In addition, there are laser-induced processes, in which the LEDs are removed from the substrate by detaching. However, since complete detachment could possibly cause tilting, shifting or twisting, it may be desirable to allow pick-up for a so-called mass transfer to a carrier without excessive holding forces or damage.

One point of view deals with the question how an avoidance of breaking edges and an improvement of the lift-off can be achieved. For this purpose, a solution is proposed in which a mechanical connection is maintained between the LED and a surrounding or underlying substrate using crystalline dielectric retaining structures. However, this mechanical connection is designed in such a way that, on the one hand, it reliably holds the chip of the LED in place mechanically, but on the other hand, it breaks when the smallest possible bending force or tensile force is exerted, thus releasing the chip for removal.

In particular, a support structure for accommodating planar chips or LEDs is proposed. By a support structure is meant here an arrangement which can accommodate a plurality of such LEDs, for example with edge lengths in the range from 1 mm to about 100 µm or from 800 µm to 150 mm. The purpose here is in particular to provide a mechanically stable fixation, for example relative to a grid or a matrix, while making the best possible use of the available space. Furthermore, this support structure is intended to be suitable for providing the plurality of chips for transfer with the aid of a transfer tool.

The support structure further comprises at least two receiving elements which are connected to the carrier substrate. By a receiving element is meant here a mechanism or functional element which is suitable for spatially fixing or holding an LED in a defined spatial position by mechanical contact, optionally in interaction with further receiving elements. A receiving element may have diameters, for example, in the range of 10 µm or less, preferably 2 µm or 1 µm. According to one example, a chip is attached to two receptacle elements.

In some aspects, the support structure comprises a planar support substrate. Such a support substrate may be, for example, a wafer, a film, a frame, or the like used in the semiconductor manufacturing field. In this context, for example, a wafer, in addition to its function as a base plate or base material for the manufacturing process of the semiconductor, can also provide a support function or carrier function for preparing a subsequent mass transfer. In addition, flexible materials such as foils are also suitable as carrier substrates.

According to one example, a receiving element may be columnar, pillar-like or post-like starting from the carrier substrate. In one embodiment, the chip rests partially but not completely on the at least two receiving elements at its corners or edges. The receiving elements are connected to the carrier substrate and are designed to releasably hold a chip between the at least two receiving elements in such a way that LED can be moved out with a defined minimum force perpendicular to the carrier structural plane.

In other words, on the one hand, a sufficiently secure hold of the LED is to be achieved by the support elements, and on the other hand, the possibility is to be deliberately created of detaching the LED with as little force as possible and feeding it, for example, to a transfer tool. For this purpose, it may be provided that the supporting surface for each supporting element is smaller than $1/20$, in particular smaller than $1/40$ and in particular in the range of $1/200$ to $1/50$ smaller than the chip surface of the LED. In an alternative embodiment, an edge length of the LED is larger than an edge length of the support element by at least a factor of 10, in particular by at least a factor of 20. In one example, the edge length is greater by a factor which is preferably in the range between 40 and 80.

By "releasable" it should be understood that there is no permanent, for example, material connection such as fusing, bonding or the like between the chip and the receiving element, but rather a non-destructive, releasable connection. The attachment may be based on a physical connection, such as an adhesive connection by Van-De-Waals forces or electron bridges. The same can be given by different materials and a suitable selection thereof between the LED and the receiving elements. In particular, this is intended to circumvent fracturing or similar processes that would involve destruction of material structures with the corresponding fragments, particles or splinters. Instead, alternative adhesion mechanisms such as exploiting mechanical friction or delamination are used herein. In particular, known limited or limited adhesion properties of materials or combinations of materials are exploited. According to one example, the LED rests between two or more receiving elements.

Adhesion forces or other adhesion forces, for example, arise at the contact surfaces, which allow the LED to be mechanically fixed in space. If a defined minimum force is now applied to the LED, for example by an attached transfer tool, detachment forces consequently become effective at the contact surfaces between the LED and the receiving elements. This defined minimum force can be influenced by a suitable selection of materials or material combinations at these contact surfaces.

The contact areas or overlaps can, for example, have dimensions in the range from 0.05 $\mu m^2$ to 10 $\mu m^2$, particularly in the range from 1 $\mu m^2$ to 8 $\mu m^2$. Here, it is desirable that, on the one hand, a secure hold of the LED on the support structure is achieved. On the other hand, it is essential for an effective and fast mass transfer of the LED that the LEDs can be lifted up and detached with as little force as possible. For this purpose, it may be provided that the ratio between the contact area of each element and chip and the total chip area is smaller than $1/20$, in particular smaller than $1/40$ and in particular in the range of $1/80$ to $1/50$ smaller than the chip area. In an alternative embodiment, an edge length of the LED is larger than an edge length of the receiving element by at least a factor of 10, in particular by at least a factor of 20. The available area of the receiving element may be larger, but the LED rests only on a part of this area. The contact area of the chip is thus at least 20 times, in particular at least 40 times, smaller than the total chip area.

A suitable compromise must be found here, for example through the appropriate selection of materials or material combinations as well as the dimensioning and placement of the contact surfaces. The defined minimum force can also be influenced by designing the size and shape of these contact surfaces. Large contact areas consequently lead to a higher minimum force required to release the LED from the support structure. In addition to holding principles caused by friction or lamination, magnetic, electrical or similar holding forces are also conceivable.

According to a further example, it is also possible that the support structure comprises only a single receiving element with which an LED is held. Due to the low weight of the semiconductor structures, it may be conceivable that a contact surface of suitable shape and sufficient size between the single receiving element and the LED can provide sufficient hold in combination with a suitably high minimum force for detaching the LED.

In one embodiment, a substrate for fabricating the LEDs may also serve as a support structure. In such a case, a sacrificial layer may be provided. During the manufacturing process, the LED is thereby connected to the growth substrate. To expose the finished LED, gas- or plasma-based etching processes are used to remove this intervening sacrificial layer, for example, so that a space is created between the LED and the wafer. A thickness of the sacrificial layer is, for example, 100 nm (nanometers) to 500 nm. The idea here is that, with the sacrificial layer removed, the receiving elements perform a retaining function for the LED on the support structure. In one embodiment, the receiving elements may have the shape of an anchor.

The LED is usually pulled off in a direction away from the carrier substrate with a force vector that is at least partially perpendicular to a carrier substrate plane, which is to be understood in the x-y direction. The receiving elements thereby remain on the carrier substrate and in particular do not break. As a result, no residue of the pick-up element remains on the LED, which may cause problems during subsequent processing. In one aspect, the force vector is substantially perpendicular to the surface. Further, the holding force holding the LED to a die is greater than the holding force holding the LED to the receptacle element at the time just before lift-off to at least shortly thereafter.

According to one aspect, at least one receiving element is configured to simultaneously hold and/or support at least one further, adjacently arranged LED. For example, the receiving element is configured to support two, three or even four LEDs arranged adjacent to each other. Adjacent in this context means that sides of the LEDs are substantially parallel opposite each other. A distance can be provided between two adjacent LED's so that they do not influence each other when lifted off. Particularly in the case of force vectors which are not completely perpendicular, such a spacing is expedient in order to prevent two adjacent LEDs from colliding during lift-off. Accordingly, the distance between two adjacent LEDs may also depend on a component of the force vector parallel to the LEDs during lift-off. In some considerations, the distance between two LEDs is 5% of the edge length, or is in the range of 1% to 10% of the edge length of the LEDs.

The considerations for this feature can be summarized as follows: Holding structures for LEDs often take up space, which should ideally be minimized in order to achieve a higher yield on a wafer. Due to the manufacturing process, the LEDs are in turn arranged next to each other on a wafer in a regular structure.

As mentioned, there are gaps due to the process. The inventors now propose to position a holding element between two adjacent LEDs, so that this one holding element supports or holds several adjacent LEDs. It may be seen as an advantage here that computationally less than one whole support structure per component is achievable. This may reduce a total number of receiving elements, thus resulting in a space saving and consequently a cost saving. In addition, an overall chip yield remains substantially constant as no additional space is required for the retaining structure on the wafer at the expense of the number of LEDs.

For example, a receiving element may have contact surfaces arranged opposite each other, each of which is then in mechanical contact with the LED adjacent in that direction. The receiving elements may then be distributed and arranged over a surface of the carrier substrate such that a minimal number of receiving elements are used to securely hold the LEDs. This may be advantageous, for example, for effective use of a transfer tool to enable effective and rapid pick-up of the LEDs. According to one aspect, the receiving elements are arranged on the carrier substrate such that an LED is held by exactly three receiving elements. The choice of three receiving elements may be an advantageous compromise here in that good spatial stabilization may be achieved here in combination with an advantageous distribution of the holding forces. Displacement or tilting, in particular in the lateral direction on the carrier substrate, can be effectively prevented here. In this regard, a receiving element can engage the chip at various lateral regions in the X-direction and Y-direction, for example centrally, off-centre or at an edge or corner. Several pick-up elements can also be arranged on one and the same side of an LED.

According to one aspect, a delamination layer is provided on the LED or the receiving element for moving the LEDs out of the support structure. As used herein, the term delamination is intended to describe a detachment process that occurs when two surfaces, or more generally, the junction of two layers, come into contact. This can concern similar materials, but also material connections or different material surfaces.

The deliberate creation of a so-called delamination layer is intended to prevent fracture processes or material-destroying or structure-altering processes and instead bring about a non-destructive detachment of the layers or surfaces from one another. In this regard, certain combinations of materials may be used, for example a combination of $SiO_2$ and $Al_2O_3$, but also the use of non-oxidizing metals such as silver, gold or similar materials in combination with a dielectric such as $SiO_2$. Thus, in one aspect, the surface of the receiving element is surrounded by the delamination layer such that the delamination layer is formed between the LED and receiving element. The delamination layer may be only a few nm thick, for example in the range of 5 nm to 50 nm. In one aspect, the delamination layer may also be formed as an etch stop layer or equally optionally extend over further portions of the support structure.

According to one aspect, the receiving elements are arranged in a mesa trench of a semiconductor wafer. As mentioned above, it is generally desirable to optimize the use of space on a wafer to increase yield. Retaining structures for LEDs often take up additional space. In the manufacturing process, various process steps are used to create three-dimensional structures in which, for example, an LED is formed as an elevation or mesa at the end. So-called mesa trenches are formed between these individual LEDs.

The term mesa trench is intended to describe a comparatively steep flank-like feature on the sides of an LED, with the trench, i.e. the area without epitaxy, referencing the deep structure lying in between. For example, the mesa trench may have an edge steepness in the range of 30° to 75°, in particular of 45°. The idea here is now to arrange the pickup element precisely in this spatial region, which is available anyway, without taking up additional space on the wafer. In this way, a better utilization of the available space on the wafer can be achieved.

According to one aspect, the support structure and the receiving elements are integrally formed. This may mean, for example, that the receiving elements are part of the carrier substrate. Here, the carrier substrate may again be a wafer, for example, but may also be a PCB board, foil, frame or similar structure. In the latter cases, this means that the receiving elements themselves are made of a different material and/or structure as the carrier substrate. This can be realized in a manufacturing process, for example, by selectively preserving the originally existing wafer structures in a localized manner via the various process steps and, for example, not removing them by etching processes. These structures then serve as receiving elements and retaining structure for the finished LEDs.

In one aspect, the receiving elements are configured to hold an LED laterally and from an underside of the LED. In one aspect, to hold an LED on an underlying supporting substrate, it may be useful to provide a partial contact surface or support surface that provides a mechanical stop in the Z-direction, that is, in the direction of the supporting substrate. At the same time, a spatial fixation in lateral direction, i.e. in X-direction and Y-direction can be provided by additionally providing a lateral hold. In this way, on the one hand, a stable spatial fixation can be achieved in the direction of the carrier substrate and in the lateral direction, and on the other hand, an easy lifting of the LEDs away from the carrier substrate in the Z-direction can be made possible by a transfer process or a transfer tool.

In one aspect, the receiving elements have LED retaining surfaces that slope away relative to the carrier substrate plane, such that as the LEDs are moved away from the receiving elements, a retaining force on the LED is reduced. In other words, the retaining surfaces move away from the LED as the LED is moved in a direction away from the support substrate. This may also be understood to mean that a holding force successively decreases as the LED is lifted away from the support structure, for example by a transfer tool. This is intended to advantageously reduce the force required to pull off the LED, in particular to reduce run times of the process steps and to increase the quality of a transfer process.

The present disclosure will be further explained by the following detailed description. The detailed description and specific examples disclose various aspects and embodiments to illustrate the proposed principle. Those skilled in the art understand from the guidance in the detailed description that changes and modifications may be made within the scope of the disclosure.

It is therefore to be understood that the disclosure disclosed herein is not limited to the particular components of the devices or steps of the methods described, as such device and method may vary. It is also to be understood that the terminology used herein is for the purpose of describing particular embodiments only and is not intended to be limiting. It should be noted that, as used in the description and the appended claim, the definite and indefinite articles are intended to mean that there is one or more of the elements, unless the context expressly dictates otherwise. For example, references to "an entity" or "the entity" may include multiple devices and the like. In addition, the words "comprising," "including," and similar phrases do not exclude other elements or steps.

So now show.

In the following, some concepts for measures to improve a transfer in the form of an improved mass transfer printing process will be shown. The background of the process is a transport of LEDs of a wafer onto a carrier surface of a display. There, the individual LEDs are fixed and fastened as well as electrically connected. On the one hand, the dimensions of the individual LEDs are in the range of only a few [µm]s, on the other hand, a large number of these LEDs must be transferred locally at the same time. This often involves transferring several thousand such structures from a large number of wafers onto a common carrier surface.

In the example illustrated herein in FIG. 1, a wafer 12 is first provided on which epitaxial layers have been formed by various semiconductor fabrication processes, which are then used to form the individual LEDs 16. In some aspects, the LEDs may emit different colors and wavelengths in operation. This is indicated here by the different shades. The LEDs are formed flat on at least their bottom and/or top surfaces, for example, to allow for ease of attachment and transportation. As part of the manufacturing process, the LEDs 16 may be mechanically separated from the wafer 12. This is done by removing a so-called sacrificial layer, optionally supplemented by one or more release layers.

Figure 1A:
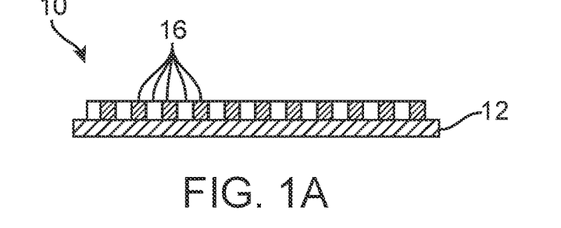
FIGS. 1A to 1D show the schematic sequence of a mass transfer printing process for a plurality of LEDs on a wafer.
Figure 1B:
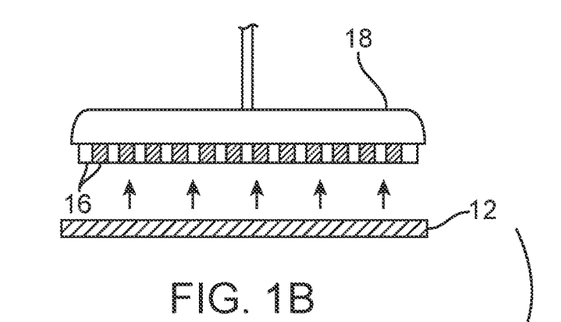

FIG. 1B shows how an elastomeric die 18 is moved vertically towards the wafer 12 from above, and adheres to a surface of the LEDs 16 by a suitable surface structure of the elastomeric die 18. For example, a maximum tensile force may be proportional to a size of the surface of the LED 16. Adhesion may be produced, for example, by silicone materials, in particular by so-called PDMS elastomers. Due to the separation of the LEDs 16 from the wafer 12, the LEDs in their plurality may be lifted off the wafer 12 together, adhering to the elastomer stamp 18. This elastomer stamp 18 is now moved in a transfer movement away from the wafer 12 towards, for example, a support surface 14 of a display mounted adjacent thereto. This can be done, for example, with the aid of a transfer tool, wherein the elastomer stamp 18 is to be regarded as a part of such a tool.

Figure 1C:
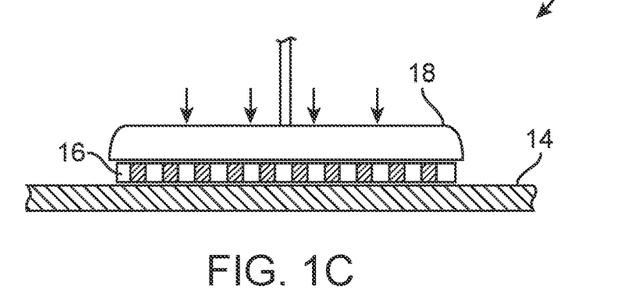
Figure 1D:
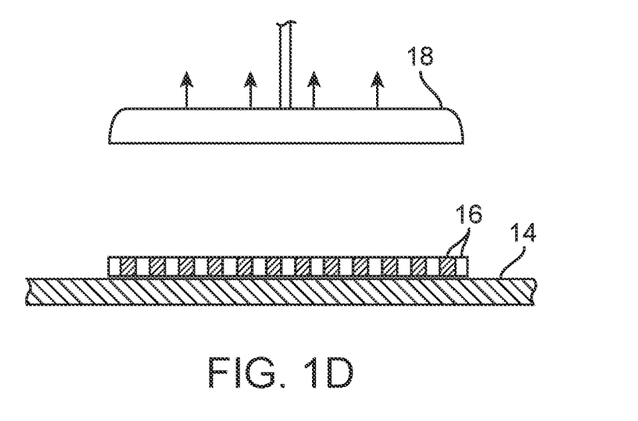

In FIG. 1C, the elastomer stamp 18 is now initially located above the carrier surface 14 and is lowered onto a surface of the carrier surface 14 in a lowering movement. In a subsequent step, shown in FIG. 1D, the LEDs 16 are detached from the elastomer stamp 18, after which the elastomer stamp 18 is moved upwards, for example to start a new transfer cycle. The LEDs 16 may be permanently attached to the support surface 14 by an adhesive process, for example.

The steps illustrated in FIGS. 1A to 1D indicate that, due to the large number of LEDs 16, reliable and accurate placement in as short a time as possible is desirable. In particular, when the LEDs 16 are picked up by the punch 18, it may be desirable to keep the forces involved low on the one hand and to achieve reliable positioning and holding of the LEDs 16 on the wafer 12 on the other hand. In particular, avoiding variations in the holding force or excessive holding forces on the wafer and/or on the stamp may provide significant improvements in this regard.

Referring back again to FIGS. 1 and 2, these show a further embodiment comprising a support structure 10 according to some proposed principles for avoiding breaking edges and improving lift-off. In principle, the basic structure corresponds to that shown in FIG. 1A. In particular, the wafer shown in FIGS. 1A and 1B comprises the wafer structure shown below, wherein FIG. 2 refers to a simplified top view of a wafer 12 from a top surface. Three LEDs 16 can be seen, which in this example are each rectangular in shape and are arranged next to each other. Other shapes of chips are also possible in this respect, for example hexagonal. On a wafer 12, a plurality of such LEDs 16 arranged side by side may be provided on an area of, for example, 16 inches or 18 inches.

Figure 2:
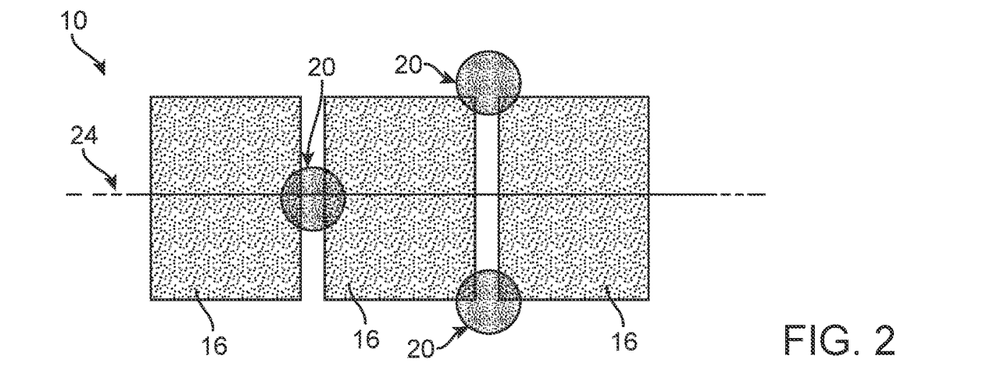
FIG. 2 a support structure according to the proposed principle in a top view with 3 receiving elements.

Prior to a transfer process, these LEDs 16 are mechanically detachably disposed on the wafer 12. This means that they can be removed by a stamping tool 18. In the example shown here, the LEDs 16 are partially detached from the wafer 12 at their underside (not shown) and are now held by receiving elements 20. The receiving elements, which appear round here through plan view, may be columnar or post-like with, for example, a round, angular or elliptical cross-section made from an underlying supporting substrate 22. As shown, the LED 16 shown here in the center is held in position by a total of three support elements 20. In particular, due to the three support points, coplanarity, i.e. a stable same planar arrangement in the same plane as the other LEDs 16 from the point of view of the distribution of forces, can be achieved. Two of the receiving elements 20 each receive two LEDs 16 at their corners or edges.

In each of the following FIG. 3A to FIG. 3D, a vertical sectional view (see line 24 in FIG. 2) is shown for various possible embodiments of a support structure 10. A wafer 12, or more generally a carrier material or bonding material, serves as a base for mechanical stabilization and for receiving other components such as electrical connections, electronic control elements and the like. Vertically above this is a first release layer 26. The release layer 26 serves to enable controlled delamination, i.e. deliberate and controlled detachment of the layers from each other by a defined tensile force. Further, such a layer may serve as an etch stop layer to leave adjacent layers unchanged during an etching process. This can, for example, replace a fracture process, as used in the prior art, with a detachment process in which no disturbing residues remain on the LED.

Figure 3A:
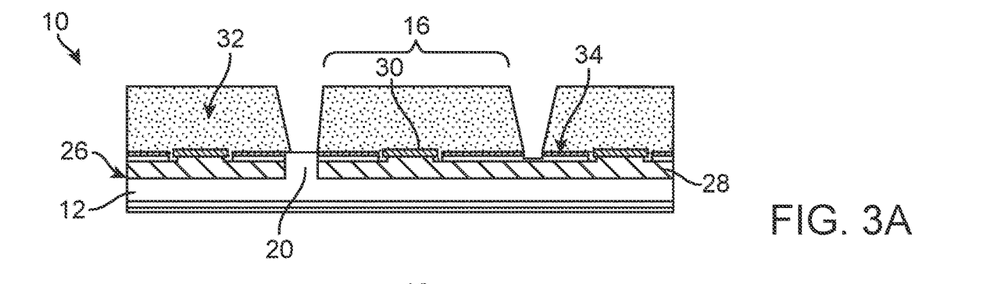
FIGS. 3A to 3E show a total of four vertical cross-sectional views through a support structure for receiving planar LEDs suitable for the proposed transfer.
Figure 3B:
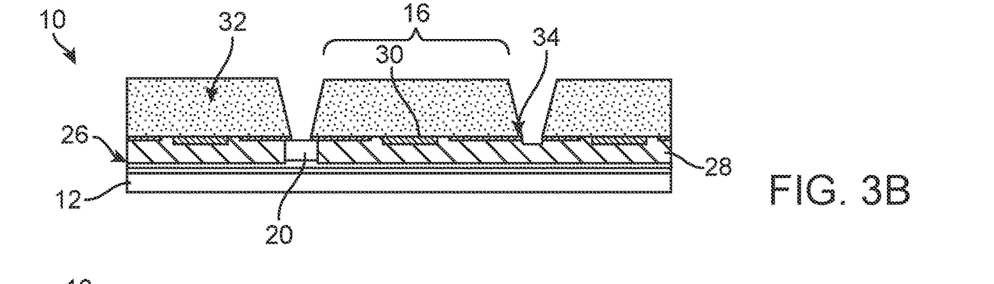

Further provided is a sacrificial layer 28, which is also referred to as a sacrificial layer. The background to this is that silicon, for example, is used as a material for such layers, which can then be removed in a process step by chemical processes, for example in order to separate the LED 16 from the underlying wafer 12. The LED 16 further comprises a contact pad 30, which here may for example comprise a semiconductor active region, such as a p-n junction. By way of example, FIG. 3A and FIG. 3B show a cross-section of an LED 16 comprising an epitaxial layer 32. This epitaxial layer 32 may additionally be supplemented by a further second release layer 34 formed between the sacrificial layer 28 and the epitaxial layer 32. This second release layer 34 may be arranged at different locations, depending on the embodiment.

FIGS. 3A and 3B each show an embodiment where a receptacle element 20 is a post-like, column-like or pillar-like protrusion from the wafer 12 extending vertically in one piece between two LEDs 16 through the sacrificial layer 28 and terminating in front of the epitaxial layer 32. Here, the epitaxial layer 32 tapers narrowly upwardly, thereby forming a V-shaped mesa trench (see also FIGS. 3C and 3D for alternatives). While in FIG. 3A the second release layer 34 extends to a side surface or partial underside of the contact pad 30, in FIG. 3B the second release layer 34 terminates horizontally in front of the contact pad 30, with the sacrificial layer 28 filling the remaining gap. A gaseous or liquid etching substance, for example, can then reach the sacrificial layer 28 via the mesa trench 38, i.e. the gap between two LEDs 16.

In FIG. 3B, the delamination layer on the exposed surface of the receiving element is also removed by the etching process. By controlling the etching process, the removal of the delamination layer can be selectively adjusted. For example, with respect to the etching process used, the delamination layer may have a significantly lower etching rate than for the sacrificial layer 28. This may ensure complete removal of the sacrificial layer without overly attacking the delamination layer or the support substrate by the etching process. In an alternative embodiment, but not seen here, the etching process is also used to etch through the delamination layer and into the receiving member. In other words, the funnel-shaped recess between the two LEDs is continued in the receiving element. This results in a V- or U-shaped recess for the receiving element, and two columns remain on which the LEDs rest. The depth of such an etch in the receiving element may also be adjusted by the process. Generally, however, the entire receptacle element is not etched through. Rather, the receiving element is only etched to half of its height or less, so that sufficient stability of the receiving elements is ensured. In particular, it is ensured that the remaining columns do not break when the LEDs are removed, but that the LED is lifted off by overcoming the adhesive force of the delamination layer.

Figure 3C:
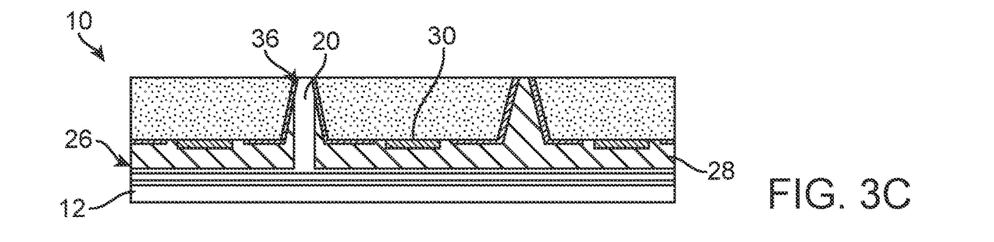
Figure 3D:
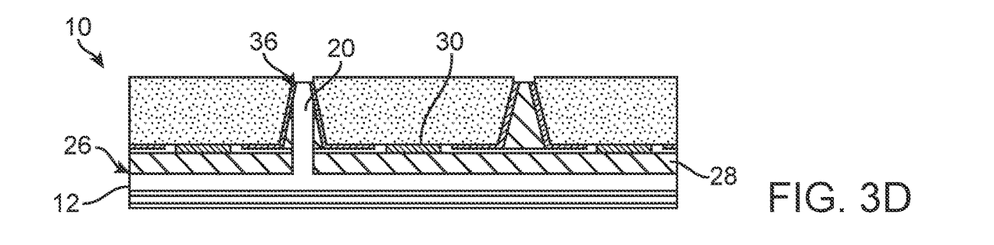

FIGS. 3C and 3D show a further embodiment, in particular with regard to the design of the receiving element 20. In this case, the receiving element 20 extends in one piece from the plane of the wafer 12 through the sacrificial layer 28 to an opposite side of the support structure 10. In this case, the receiving element 20 is tapered at its upper end or is designed with inclined LED holding surfaces 36, which can allow the LEDs 16 to be lifted off more easily while at the same time being securely seated on the wafer 12. In FIG. 3D, according to one example, the receiving member 20 terminates before the end of the epitaxial layer 32 in the vertical direction. The contact pad 30 connects the layers internal to the LED, and in particular the light emitting layer. As shown in FIGS. 3B and 3D, the contact pad 30 is in each case the vertically lowermost element and can thereby come into direct mechanical and thus electrical contact with an electrical contact element (not shown) on a support surface of the display or module, optionally without additional bridging solder or conductive adhesive. A contact pad 30 may, for example, have edge lengths in the range of 20 to 100 μm.

Figure 3E:
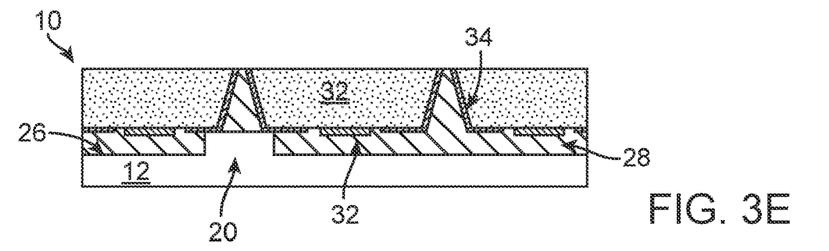

Finally, FIG. 3E shows an embodiment in which the receiving element is significantly broadened and the delamination layer extends completely over the surface of the receiving element. As shown in FIGS. 3C and 3D, sacrificial layer 28 extends through the funnel-shaped region between the individual LEDs with their epitaxy 32. Each LED comprises an epitaxy whose lateral dimensions are larger on the light emitting side than on the side facing contact pad 32. In other words, the LEDs widen starting from the side with the contact pad 32.

This results in a slope which is "inverted" V-shaped in the cut structure shown. On the surface of the surfaces of the epitaxial layer 32, in particular on the sloping sides forming the funnel and on the surface containing the contact pad, a further layer 34 is applied. This serves as an etch stop and, together with the delamination layer 26, generates a defined adhesive force. For lift-off, the sacrificial layer 28 in the V-shaped areas between the LEDs and below is now removed by plasma etching, gaseous etching or another process, so that the chips rest only with their layer 34 on the delamination layer of the receiving elements.

Figure 4:
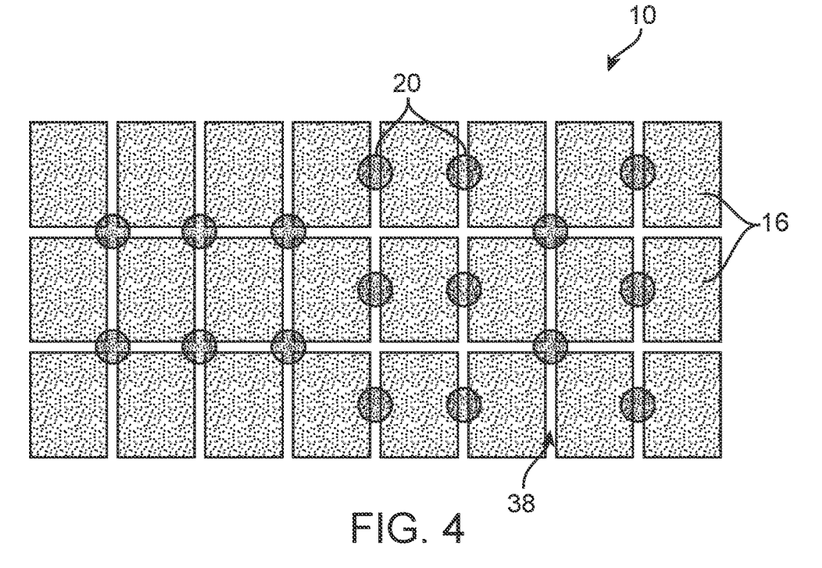
FIG. 4 a layout of a support structure according to some aspects of the proposed concept with planar LEDs and a plurality of receptacle elements in different arrangements.
Figure 5:
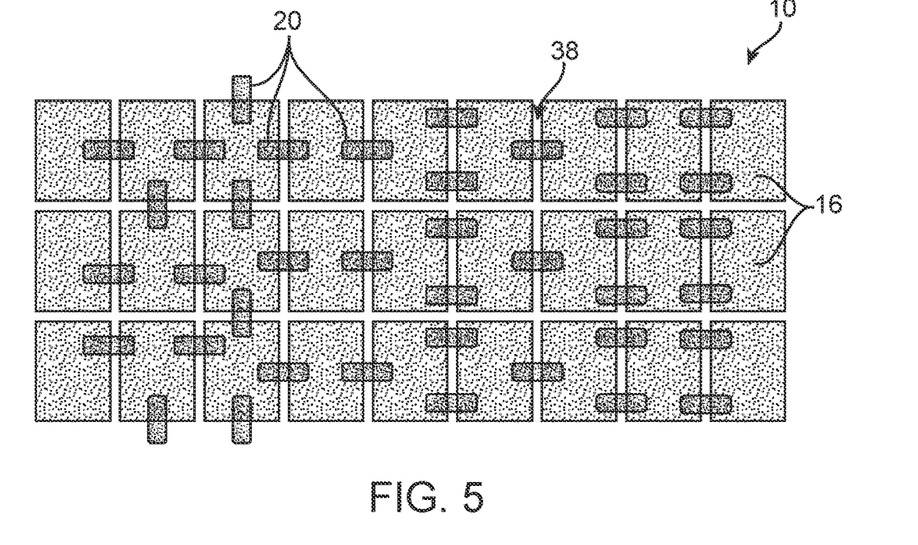
FIG. 5 shows another layout of a support structure prepared and suitable for the proposed transfer process.

FIG. 4 and FIG. 5 each show an example of a support structure 10 with, by way of example, 24 LEDs 16 arranged in a matrix on a wafer (not shown). In FIG. 4, a total of 17 receptacle elements 20 are shown. These are partly arranged in a mesa trench 38 between each two adjacent LEDs 16, and partly also at corners of the respective LEDs 16. This arrangement may result in a total of fewer receptacle elements 20 being required than a total number of LEDs 16. Additionally, in the example shown here, a receiving element 20 may support or receive up to four adjacent LEDs 16.

In FIG. 5, the base of the receiving elements 20 is not round as in FIG. 15b, but comprise a rectangular or square base. This means that the contact surface 36 changes with which the receiving element contacts the LED 16. This can ensure stable reception of the LED 16, even if the LED 16 shifts slightly in its position in the x-direction or y-direction. In other words, a total contact area of all contact surfaces 36 on the LED 16 remains the same, or at least approximately the same, even with smaller shifts in the lateral direction. Furthermore, the receiving elements 20 may also be arranged at the outer edge of a support structure 12 and engage an outer lateral surface of an LED 16. Exemplarily, it can be seen here that exactly three support points can provide particularly stable spatial stabilization for the same LED. Again, a support element 20 may support two or more adjacent LEDs 16, thereby reducing space requirements and thus costs through multiple use. In the examples shown, the support area is shown greatly enlarged compared to the chip area. In practical implementations, the support area is significantly smaller so that the adhesion force is reduced so that the delamination layer adheres to the support and does not break away.

Figure 6A:
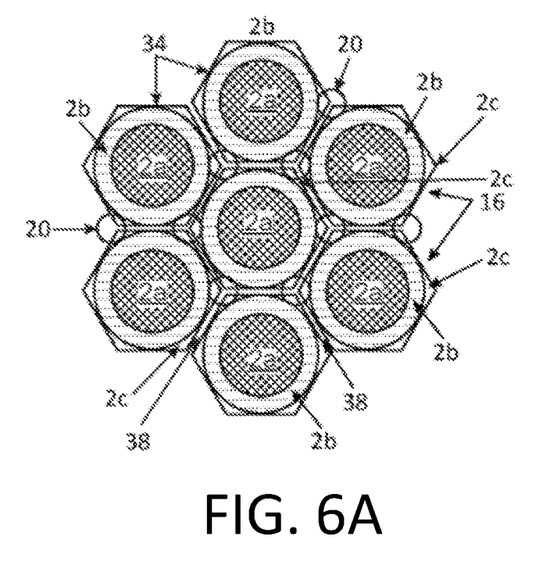
FIG. 6A shows another embodiment of a support structure.

FIG. 6A shows an embodiment in which a plurality of LEDs 16 are monolithically fabricated on a supporting substrate. Each LED has the shape of a hexagon, i.e. 6 side faces each facing a side face of an adjacent LED. The corners of each LED rest on a receiving element 20. Moreover, flank structuring has been performed, i.e. trenches have been etched so that the LEDs are held only by the receiving elements. Each LED comprises a centrally arranged and circular active area 2a. The area can be chosen to be of different sizes. In this example, however, it is surrounded by an area 2b having a diameter substantially equal to the distance between two opposite side surfaces of an LED. In other words, the area extends to the side flank of each hexagonal structure of the LEDs, while the corners of each LED just do not include the area 2b.

Figure 6B:
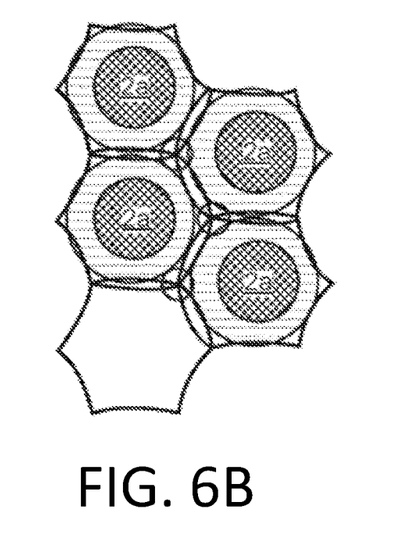
FIG. 6B represents an alternative to the previous embodiment.

FIG. 6B shows another embodiment created by improved mask structuring. The background of this embodiment is to reduce the number of required photomasks and transfer steps. In this embodiment, a photomask was chosen which results in smaller bulges at the corners. This results in this slightly changed structure.

In the examples shown herein, the LEDs are fabricated using various semiconductor techniques. The wafer to which the transfer is made may have contact surfaces so that electrical contact is possible. Likewise, control, current sources and other elements may already be present in this wafer. The LEDS transferred in this manner are then further processed in some embodiments. For example, a converter layer or a light shaping element is applied to the LED. Basically, in these embodiments, individual LEDs were transferred. However, the method is not limited to such. Similarly, the foregoing modules may be formed with these support structures to allow for easier transfer of such modules. In this case, the columns or the carrier elements are formed after it is known what size the modules are to have.

REFERENCE LIST 10 support structure
12 wafer

14 Carrier surface of a display
5, 16 Microchip
18 Stamp/stamping tool
20 Receiving element
22 Carrier substrate
24 Section (vertical)
10, 26 Delamination layer
28 Sacrificial layer
30 Emitter chip
32 Epitaxial layer
34 Second release layer
15, 36 Microchip holding areas
38 Mesa recess

The invention claimed is:

1. A support structure with planar optoelectronic components, including light emitting diodes (LEDs), comprising:
   a flat carrier substrate; and
   at least two receiving elements configured to detachably retain a first LED between respective contact areas of the at least two receiving elements that are in mechanical contact with the first LED, wherein the first LED can be moved out with a defined minimum force perpendicular to a carrier structural plane, wherein at least one receiving element of the at least two receiving elements is configured to simultaneously retain and/or support a second, adjacently arranged LED,
   wherein at least one of the two receiving elements has a first contact area and a second contact area, the first contact area in mechanical contact with the first LED and the second contact area in mechanical contact with the second, adjacently arranged LED.

2. The support structure according to claim 1, wherein the receiving elements are arranged on the support substrate such that the first LED is held by three receiving elements.

3. The support structure according to claim 2, wherein a holding area between the first LED and one of the three receiving elements is about twice the holding area between the first LED and another one of the three receiving elements.

4. The support structure according to claim 2, wherein a holding area between the first LED and one of the three receiving elements extends along a side edge of the first LED and a holding area between the first LED and another one of the three receiving elements extends along a corner of the first LED opposite the side edge.

5. The support structure according to claim 1, wherein at least two receiving elements of the three receiving elements are each designed to hold and/or support a further adjacently arranged structural element.

6. The support structure according to claim 1, wherein a delamination layer is provided, which is arranged between the receiving element and the optoelectronic component and is configured to remain on the receiving element when the defined minimum force perpendicular to a carrier structural plane is applied to the first LED.

7. The support structure according to claim 1, wherein the receiving elements are arranged in a mesa trench of a semiconductor wafer.

8. The support structure according to claim 1, wherein the support substrate and the receiving elements are integrally formed.

9. The support structure according to claim 1, wherein the receiving elements are configured to hold an optoelectronic device laterally and from an underside of the device.

10. The support structure according to claim 1, wherein the receiving elements comprise component retaining surfaces sloping away relative to the support substrate plane, so that a retaining force on the optoelectronic component is reduced when the component is moved away from the receiving elements.

11. The support structure according to claim 1, wherein the at least two receiving elements are spaced apart such that the first contact area is in mechanical contact with a lateral corner portion or side surface of the first LED.

12. The support structure according to claim 1, wherein a contact area between the receiving elements and the optoelectronic component is smaller than $1/20$, in particular smaller than $1/50$, of a Total Area of the Component.

13. The support structure according to claim 1, wherein the at least one receiving element partially supports the first LED and the second LED, and a portion of a surface of the receiving element is exposed between the first and second LEDs or rises between the first and second LEDs.

14. An optoelectronic device, comprising:
   a semiconductor layer stack having an active layer disposed on a support structure with planar optoelectronic components including light emitting diodes (LEDs); and
   wherein the support structure comprises:
      a flat carrier substrate; and
      at least two receiving elements configured to detachably retain a first LED between respective contact areas of the at least two receiving elements that are in mechanical contact with the first LED, wherein the first LED can be moved out with a defined minimum force perpendicular to a carrier structural plane, wherein at least one receiving element of the at least two receiving elements is configured to simultaneously retain and/or support a second, adjacently arranged LED,
      wherein at least one of the two receiving elements has a first contact area and a second contact area, the first contact area in mechanical contact with the first LED and the second contact area in mechanical contact with the second, adjacently arranged LED.

15. The optoelectronic device of claim 14, wherein the optoelectronic device has an edge region formed by a mesa trench, the active layer in the edge region having a bandgap increased by quantum well intermixing.

16. The optoelectronic device according to claim 14, wherein an edge region of the optoelectronic device comprises a protuberance disposed on the support structure.

17. A method for transferring at least two optoelectronic components including light emitting diodes (LEDs), the at least two optoelectronic components being arranged on a common receiving element of a support and the support comprising a sacrificial layer between the at least two optoelectronic components and the common receiving element on which the optoelectronic components are arranged, the method comprising:
   removing the sacrificial layer on which the optoelectronic components are arranged, so that the optoelectronic components are held by the common receiving element; and
   removing at least one of the at least two optoelectronic components from the common receiving element.

* * * * *